United States Patent [19]

Hirakawa

[11] Patent Number: 5,086,005
[45] Date of Patent: Feb. 4, 1992

[54] BIPOLAR TRANSISTOR AND METHOD FOR MANUFACTURING THE SAME

[75] Inventor: Kenji Hirakawa, Yokohama, Japan

[73] Assignee: Kabushiki Kaisha Toshiba, Kawasaki, Japan

[21] Appl. No.: 533,519

[22] Filed: Jun. 5, 1990

[30] Foreign Application Priority Data

Jun. 6, 1989 [JP] Japan .................. 1-143830

[51] Int. Cl.$^5$ .................. H01L 21/266; H01L 27/06; H01L 27/10
[52] U.S. Cl. ..................... 437/32; 437/151; 437/152; 437/162; 148/DIG. 10; 357/35
[58] Field of Search .................. 437/917, 953, 32, 31; 148/DIG. 18, DIG. 11, DIG. 10, DIG. 18; 357/35, 34

[56] References Cited

U.S. PATENT DOCUMENTS

| | | | |
|---|---|---|---|
| 3,919,005 | 11/1975 | Schinella et al. | 357/34 |
| 3,919,007 | 11/1975 | Tarui et al. | 357/34 |
| 3,967,307 | 6/1976 | Muller et al. | 357/35 |
| 4,381,953 | 5/1983 | Ho et al. | 357/34 |
| 4,419,685 | 12/1983 | Sugawara et al. | 357/53 |
| 4,569,123 | 2/1986 | Ishii et al. | 437/41 |
| 4,738,624 | 4/1988 | Iyes et al. | 357/34 |
| 4,782,030 | 11/1988 | Katsumata et al. | 357/34 |
| 4,979,008 | 12/1990 | Siligoni et al. | 357/34 |

Primary Examiner—Olik Chaudhuri
Assistant Examiner—Loc Q. Trinh
Attorney, Agent, or Firm—Finnegan, Henderson, Farabow, Garrett and Dunner

[57] ABSTRACT

In a self-alignment type-lateral bipolar transistor and a manufacturing method thereof, the base width is determined not by the image resolution limit of the lithography technique, as in the prior art, but by the impurity diffusion from the polysilicon layer 118. Therefore, the self-alignment type lateral-structure pnp bipolar transistor and the manufacturing method permit the base width to be as small as possible, resulting in improvement of frequency characteristics, and reducing the size of the transistor element.

1 Claim, 7 Drawing Sheets

BIPOLAR TRANSISTOR AND METHOD FOR MANUFACTURING THE SAME

BACKGROUND OF THE INVENTION

1. Field of the Invention

The present invention relates to a bipolar transistor and its manufacturing method.

2. Description of the Related Art

A lateral-structure pnp bipolar transistor is widely used in the art of manufacturing bipolar transistor integrated circuits, since it can be made simultaneously by use of the same manufacturing process as an npn bipolar transistor. As is well known, however, the current amplification factor and frequency characteristic of the lateral-structure pnp bipolar transistor are not very satisfactory. In recent years, a large number of small-sized, high-speed operation self-alignment type npn bipolar transistors have come to be manufactured, wherein the layer for leading out the base electrode is formed of polysilicon. In accordance with this situation, a large number of self-alignment type lateral-structure pnp bipolar transistors have come to be manufactured since they can be formed simultaneously by use of the same process as the self-alignment type npn bipolar transistors.

The self-alignment type lateral-structure pnp bipolar transistor will be explained, with reference to its sectional view shown FIG. 1.

Figure 1:
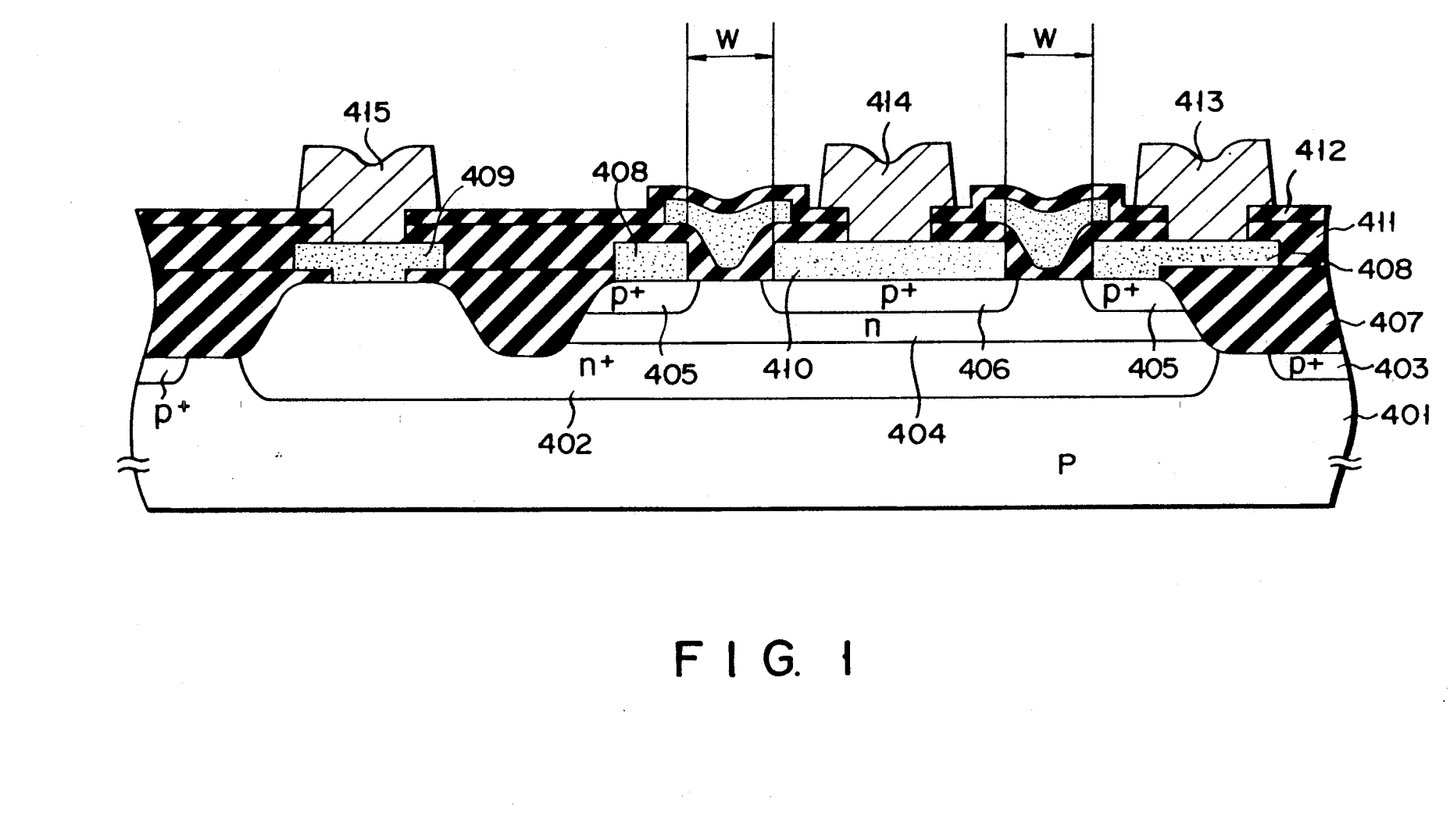
FIG. 1 is a sectional view of a conventional self-alignment type lateral-structure pnp bipolar transistor.

In FIG. 1, reference numeral 401 denotes a p-type semiconductor substrate; 402 denotes a high-concentration n+-type region; 403 denotes a high-concentration p+-type channel cut region; 404 denotes an n-type epitaxial layer; 405 and 406 denote high-concentration p+-type regions, respectively; 407 denotes an element-isolation region; 408, 409 and 410 denote polysilicon layers, respectively; and 413, 414 and 415 denote electrodes formed of aluminum, respectively. The n-type regions 402 and 404 jointly constitute a base region, the high-concentration p+-type region indicated with 405 constitutes a collector region, and the high-concentration p+-type region indicated with 406 constitutes an emitter region. The polysilicon layer indicated with 408 serves as a collector-leading layer for leading out the collector the polysilicon layer indicated with 409 serves as a base-leading layer for leading out the base, and the polysilicon layer indicated with 410 serves as an emitter-leading layer for leading out the emitter. The aluminum electrode indicated with 413 serves as a collector electrode, the aluminum electrode indicated with 414 serves as an emitter electrode, and the aluminum electrode indicated with 415 serves as a base electrode.

In the semiconductor device of the above structure, the high-concentration p+-type collector region 405 is formed by diffusing impurities from the polysilicon layer 408 (i.e., the collector-leading layer). Likewise, the high-concentration p+-type emitter region 406 is formed by diffusing impurities from the polysilicon layer 410 (i.e., the emitter-leading layer). However, since the polysilicon layers 408 and 410 are patterned by use of the lithography technique using photoresist, the base width is determined almost exclusively by the image resolution limit W of the lithography technique, i.e., the minimum design rule.

In reality, the presence of the high-concentration p+-type diffusion regions 404 and 405 makes the base width slightly smaller than the base width determined by the image resolution limit W. Therefore, the base width of a self-alignment type lateral-structure bipolar transistor can be smaller than that of a lateral-structure bipolar transistor which is not of a self-alignment type, so that the frequency characteristics of the former can be more improved than those of the latter. Under the circumstances, it may be thought to diffuse a large amount of impurities from the polysilicon layers 408 and 410 in the lateral direction, so as to reduce the base width further. However, even if a large amount of impurities are diffused, the base width can be reduced only in the surface regions of the substrate; it remains almost unchanged in the regions which are deep from the surface of the substrate. This is because impurities diffuse radially and do not diffuse in the lateral direction alone. Thus, even if impurities are diffused in large quantities, the base width cannot be greatly reduced, and the frequency characteristics cannot be improved, as intended. In summary, it is safe to say that in actual devices, the image resolution limit W of the lithography technique exclusively determines the base width. Since the image resolution cannot be easily improved by use of the presently-available technology, the base width has to be reduced by using some other method.

As mentioned above, impurities cannot be diffused in the lateral direction alone. They are inevitably diffused in the vertical direction as well. Naturally, therefore, both the collector region 405 and the emitter region 406 become deeper as a result of the impurity diffusion. If they are deepened, the emitter junction which opposes the collector junction will increase in size, resulting in improvement of the current amplification factor. However, the increase in the size of the emitter junction prevents the fabrication of a small-sized element.

In the above self-alignment type lateral-structure bipolar transistor and its manufacturing method, the base width is dependent largely on the image resolution limit W of the lithography technique. For this reason, it is impossible to obtain a lateral-structure pnp bipolar transistor which has improved frequency characteristics and is suitable for the reduction of the size of an element.

SUMMARY OF THE INVENTION

The present invention has been developed in consideration of the above circumstances, and an object of the invention is to provide a bipolar transistor which can be manufactured simultanenously by use of the same manufacturing process as npn bipolar transistors, has a reduced base width and is therefore improved in frequency characteristics, has a large-sized emitter junction opposing the collector junction and is therefore improved in current amplification factor, and is suitable for reducing the size of an element. Another object of the invention is to provide a method for manufacturing such a bipolar transistor.

To achieve the first object, the present invention provides a bipolar transistor which comprises: semiconductor substrate; first and second polycrystalline semiconductor layers formed on the semiconductor substrate, the first and second layers being separated from each other and used as an emitter-leading electrode and a collector-leading electrode, respectively; a third polycrystalline semiconductor layer formed on the semiconductor substrate and located between the first and second polycrystalline semiconductor layers, with an insulation film interposed; a first impurity-diffusion layer, of a first conductivity type, which is formed in the semiconductor substrate and is in contact with the first polycrystalline semiconductor layer; a second impurity-diffusion layer, of a second conductivity type, which is formed in the semiconductor substrate and is in contact with the first impurity-diffusion layer; a third impurity-diffusion layer, of the second conductivity type, which is formed in the semiconductor device and is in contact with both the third polycrystalline semiconductor layer and the second impurity-diffusion layer; a fourth impurity-diffusion layer, of the first conductivity type, which is formed in the semiconductor substrate and is in contact with both the third impurity-diffusion layer and the second impurity-diffusion layer; and a fifth impurity-diffusion layer, of the first conductivity type, which is in contact with both the second polycrystalline semiconductor layer and the fourth impurity-diffusion layer.

To achieve the second object, the present invention provides a bipolar transistor-manufacturing method which comprises the steps of: forming a first insulation film on a semiconductor substrate; exposing a predetermined surface portion of the semiconductor substrate by selectively removing the first insulation film; forming a first crystalline semiconductor layer on the resultant semiconductor structure; forming a first photoresist film having a predetermined pattern on the first polycrystalline semiconductor layer; ion-implanting first impurities, which are of a first conductivity type, into the first polycrystalline semiconductor layer, using the first photoresist film as a mask; removing the first photoresist film; ion-implanting second impurities, which are of a second conductivity type and have a larger diffusion coefficient than that of the first impurities, into the first crystalline semiconductor layer through the entire surface thereof; forming a second insulation film on the first polycrystalline semiconductor layer; forming a second photoresist film having a predetermined pattern on the second insulation film; forming an opening to expose a predetermined surface portion of the semiconductor substrate by selectively removing the second insulation film and the first polycrystalline semiconductor layer, using the second photoresist film as a mask, such that the first polycrystalline semiconductor layer is divided into: a second polycrystalline semiconductor layer containing both impurities of the first conductivity type and impurities of the second conductivity type; and a third polycrystalline semiconductor layer containing only impurities of the second conductivity type; removing the second photoresist films; forming a third insulation film on the resultant semiconductor structure; exposing the predetermined surface portion of the semiconductor substrate once again, by selectively removing the third insulation film such that the third insulation film remains on side walls of the opening; heat-treating the resultant semiconductor structure, so as both to form a fourth insulation film on the exposed surface portion of the semiconductor substrate and to activate the first and second impurities such that the semiconductor substrate contains: a first impurity-diffusion layer which is of the second conductivity type; a second impurity-diffusion layer which is of the first conductivity and is in contact with the first impurity-diffusion layer; and a third impurity-diffusion layer of the second conductivity; ion-implanting third impurities of the first conductivity type into the fourth insulation film; forming a fourth impurity-diffusion layer, which is of the first conductivity type and is in contact with both the second and third impurity-diffusion layers, by activating the third impurities implanted into the fourth insulation film; exposing the predetermined surface portion of the semiconductor substrate once again, by removing the fourth insulation film; forming a fourth polycrystalline semiconductor layer, which contains fourth impurities of the second conductivity, on the entire surface of the resultant semiconductor structure; and forming a fifth impurity-diffusion layer, which is of the first conductivity type, is located inside the fourth impurity-diffusion layer, and is contact with the second impurity-diffusion layer, by activating the fourth impurities to diffuse from the fourth polycrystalline semiconductor layer into the fourth impurity-diffusion layer.

In the above bipolar transistor and its manufacturing method, the base region (i.e., the third impurity-diffusion layer in the case of the bipolar transistor; the fifth impurity-diffusion layer in the case of the method) is formed by diffusion impurities from the polysilicon layer (i.e., the third polycrystalline semiconductor layer in the case of the bipolar transistor; the fourth polycrystalline semiconductor in the case of the method). Thus, the base width can be considerably reduced without being restricted by the image resolution limit of the lithography technique. Therefore, frequency characteristics, particularly high-frequency characteristics, can be satisfactorily improved. In addition, the size of an element can be reduced. Moreover, the collector region is located under the base region, and the emitter region is located above the base region. Therefore, the impurity concentration profile of the bipolar transistor is similar to that of a vertical-structure bipolar transistor, so that the emitter junction opposing the collector junction can be increased in size. Accordingly, the current amplification factor can be also improved.

DETAILED DESCRIPTION OF THE PREFERRED EMBODIMENTS

A bipolar transistor according to one embodiment of the present invention and a method for manufacturing the bipolar transistor will now be described, with reference to FIGS. 2A to 2J.

FIGS. 2A to 2J are sectional views illustrating the process in which a self-alignment type pnp bipolar transistor of the embodiment is manufactured.

Figure 2A:
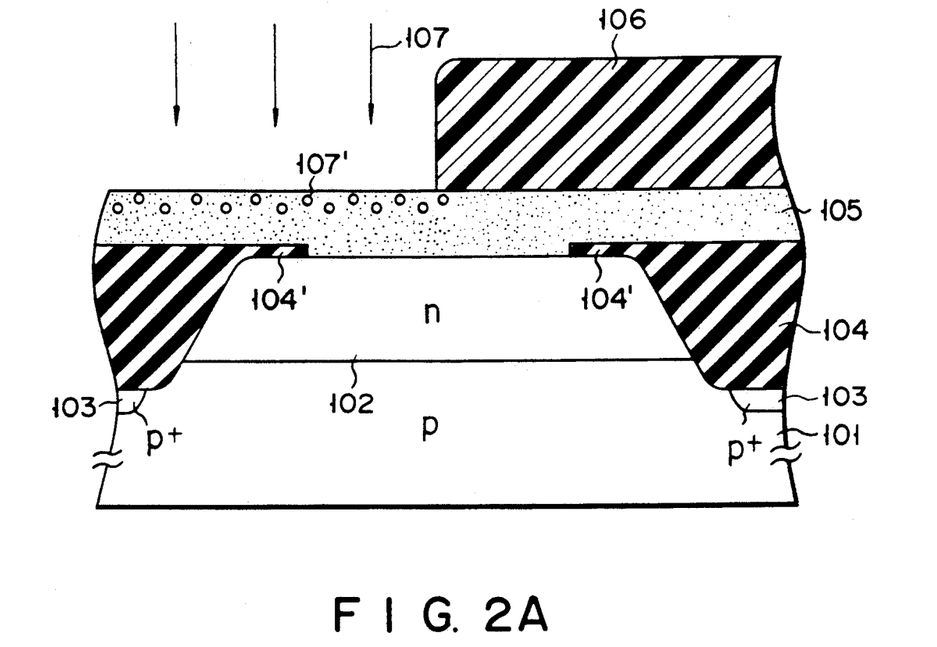
FIGS. 2A to 2J are sectional views illustrating the process in which a bipolar transistor according to one embodiment of the present invention is manufactured.

Referring first to FIG. 2A, a semiconductor substrate 101, which is of e.g. a p type, is prepared, and an n-type epitaxial layer 102 having a thickness of 1 to 2 $\mu$m is formed on the semiconductor substrate 102 by vapor-phase growth. Thereafter, the resultant semiconductor structure is selectively oxidized in the LOCOS process, to thereby form an element-isolation region 104. Before this selective oxidization, p-type impurities, such as boron (B), are ion-implanted into a portion in which the element-isolation region 104 is to be formed. During the selective oxidization, the implanted ions are diffused by heat, with the result that a high-concentration $p^+$-type channel cut region 103 is formed under the element-isolation region 104. The element isolation process available in the present invention is not limited to this. For example, a pn junction or an embedded layer may be formed for element separation. After an appropriate element isolation measure is taken, an oxide film 104' is formed on the entire surface of the semiconductor structure by a thermal oxidization process. This oxide film 104' is removed from the region in which an element is to be formed, to thereby expose that portion of the n-type epitaxial layer 102 on which the element is to be formed. A polysilicon layer 105 is grown on the entire surface of the semiconductor structure by CVD, for example, until the layer 105 has a thickness in the range of 2,000 to 4,000 Å. Then, the entire surface of the polysilicon layer 105 is coated with photoresist. A photoresist film 106, thus obtained, is patterned into a predetermined shape by photo etching. By use of the patterned photoresist film 106 as a mask, n-type impurities 107, such as phosphor (P), which have a comparatively large diffusion coefficient, are ion-implanted into the polysilicon layer 105, with a dose of $1 \times 10^{15}$ cm$^{-2}$. Reference numeral 107' in FIG. 2A denotes ions of the n-type impurities implanted into the polysilicon layer 105.

Figure 2B:
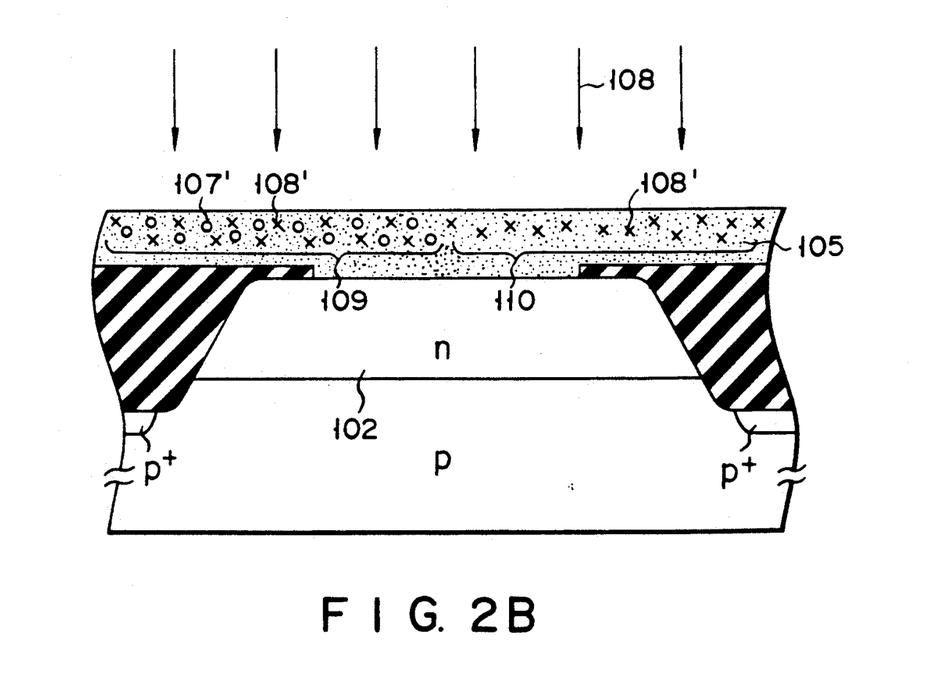

Referring next to FIG. 2B, the photoresist film 106 is removed, and then p-type impurities, such as boron (B), which have a smaller diffusion coefficient than the above-mentioned n-type impurities are ion-implanted into the polysilicon layer 105 through the entire surface, with a dose of $1 \times 10^{16}$ cm$^{-2}$. Reference numeral 108' in FIG. 2B denotes ions of the p-type impurities implanted into the polysilicon layer 105. As a result of the implantation of the p-type and n-type impurities, the polysilicon layer 105 is made to have two regions 109 and 110. Region 109 contains both n-type impurities 107' (e.g., P) and p-type impurities 108' (e.g., B), while region 110 contains only p-type impurities 108'. After the ion implantation of the n-type impurities 107 or the p-type impurities 108, the semiconductor structure may be annealed, to such an extent that the ions 107' of the n-type impurities do not diffuse from the polysilicon layer 105 into that portion of the n-type epitaxial layer 102 at which a collector electrode-leading region (to be mentioned later) is to be formed.

Figure 2C:
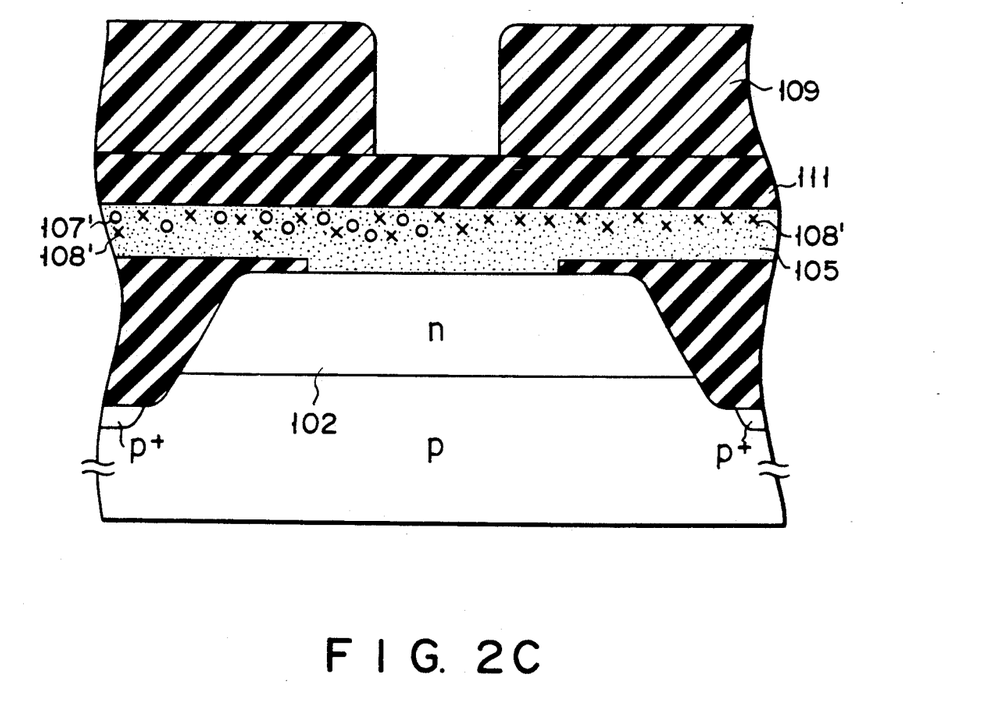

As is shown in FIG. 2C, an oxide film 111 is grown on the semiconductor structure by CVD, for example, until the oxide film 111 has a thickness in the range of 3,000 to 5,000 Å. Then, a photoresist film 109 having a predetermined pattern is formed on the oxide film 111.

Figure 2D:
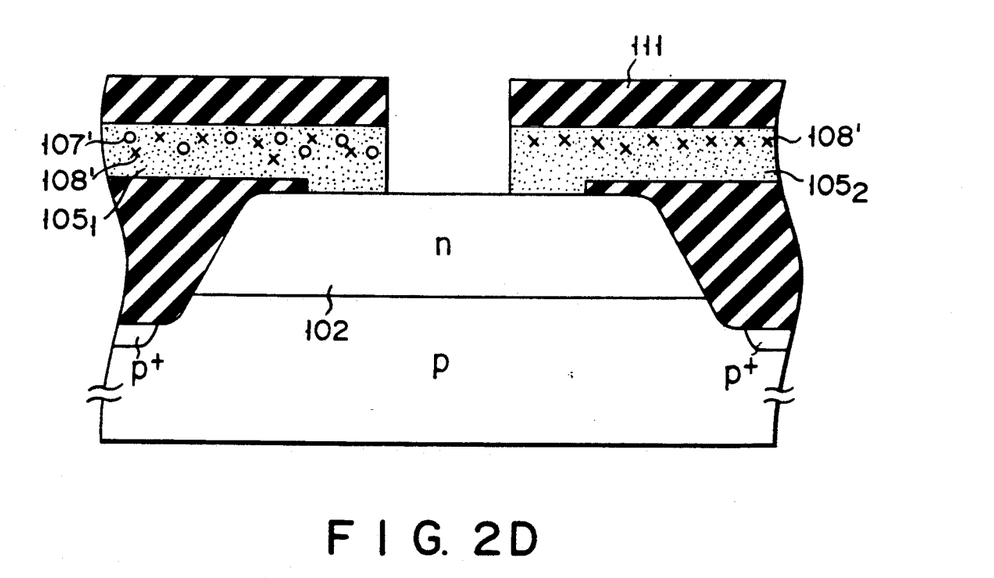
Figure 2E:
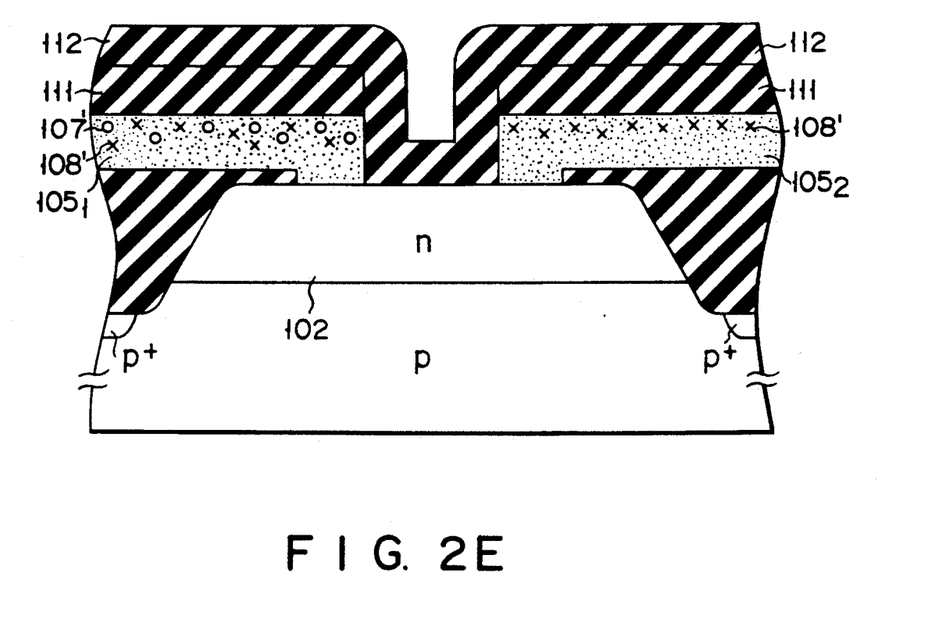

As is shown in FIG. 2D, the oxide film 111 and the polysilicon layer 105 are selectively etched out by photo etching and reactive ion etching, by use of the photoresist film 109 as a mask. By this selective etching, an opening extending to the epitaxial layer 102 is formed. Next, as is shown in FIG. 2E, an oxide film 112 is grown on the semiconductor structure by CVD, for example, until the oxide film 112 has a thickness in the range of 2,000 to 3,000 Å.

Figure 2F:
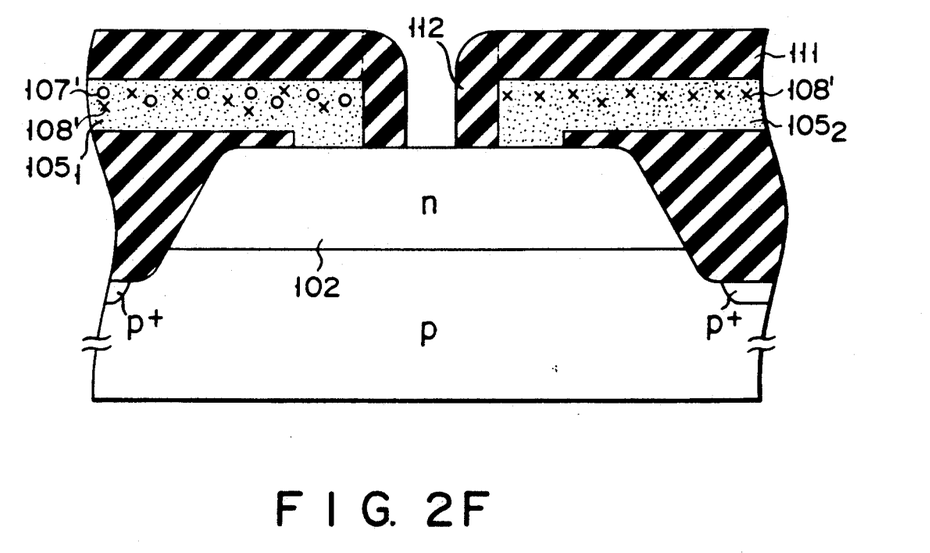

As is shown in FIG. 2F, the oxide film 112 is selectively removed by reactive ion etching, such that it remains only on the side walls of the opening.

Figure 2G:
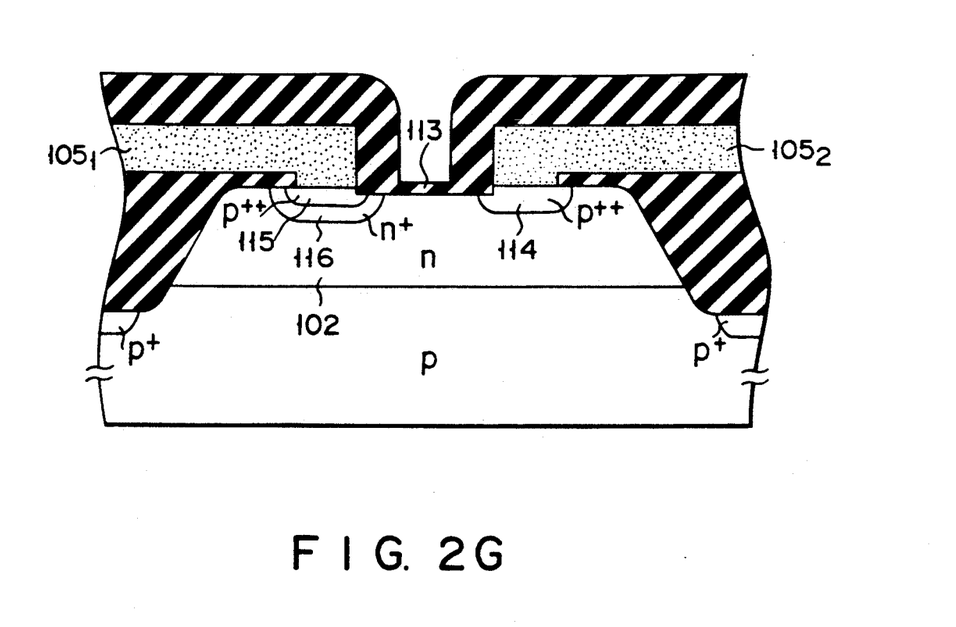

As is shown in FIG. 2G, an oxide film 113 is formed on the exposed surface portion of the epitaxial layer 102 by a thermal oxidization process, for example. Then, the semiconductor structure is annealed to a predetermined extent. By this annealing, ions 107' of the n-type impurities (e.g., P) and ions 108' of the p-type impurities (e.g., B) are diffused from the polysilicon layer $105_1$ into the n-type epitaxial layer 102. Further, ions 108 of the p-type impurities (e.g., B) are diffused from the polysilicon layer $105_2$ into the n-type epitaxial layer 102. As a result, a high-concentration p++-type emitter region 115, a high-concentration n+-type region 116 (which serves as an internal base region), and a high-concentration p++-type collector electrode-leading region 114 are formed. Since, as mentioned above, the n-type impurities (e.g., P) and the p-type impurities (e.g., B) have different diffusion coefficients, the p++-type region 115 and the n+-type region 116 can be formed simultaneously by performing the heat treatment only once.

Figure 2H:
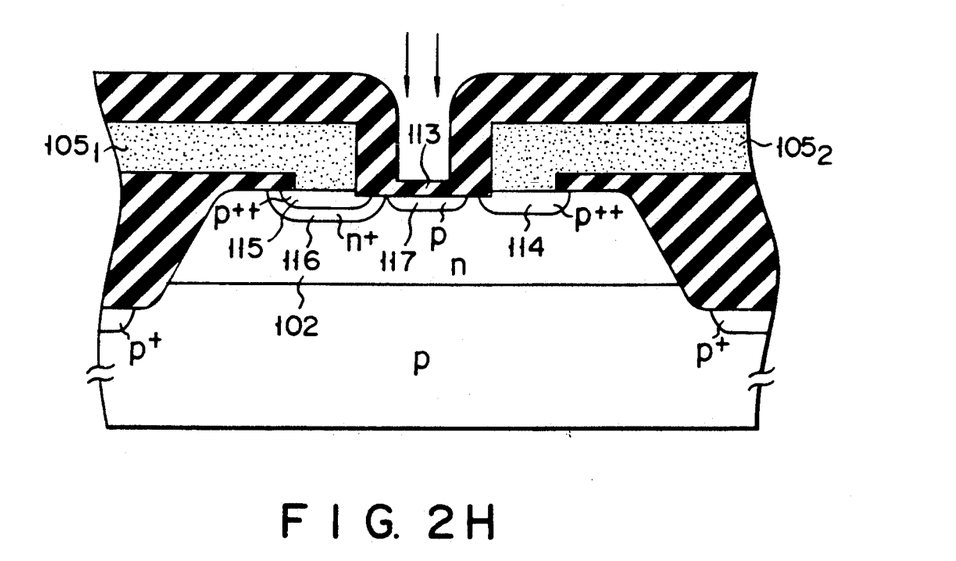

As is shown in FIG. 2H, p-type impurities, such as boron (B), are ion-implanted into the oxide film 113 formed inside the opening, with a dose of $1 \times 10^{13}$ cm$^{-2}$, and thermal diffusion is carried out at 950° C. By so doing, a p-type collection region 117 is formed under the oxide film 113.

Figure 2I:
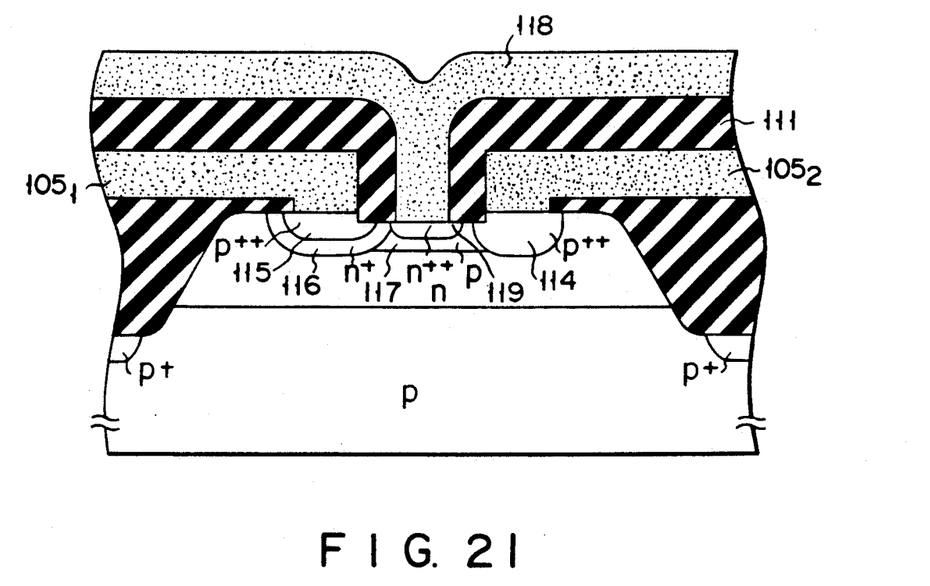

As is shown in FIG. 2I, the oxide film 113 inside the opening is removed by etching. Then, a polysilicon layer 118 containing n-type impurities, such as arsenic (As), is grown on the semiconductor structure by CVD, until the polysilicon layer 118 has a thickness in the range of 1,000 to 3,000 Å. With the n-type impurities thermally diffused from the polysilicon layer 118, a high-concentration n++-type region 119 serving as an external base region is formed.

Figure 2J:
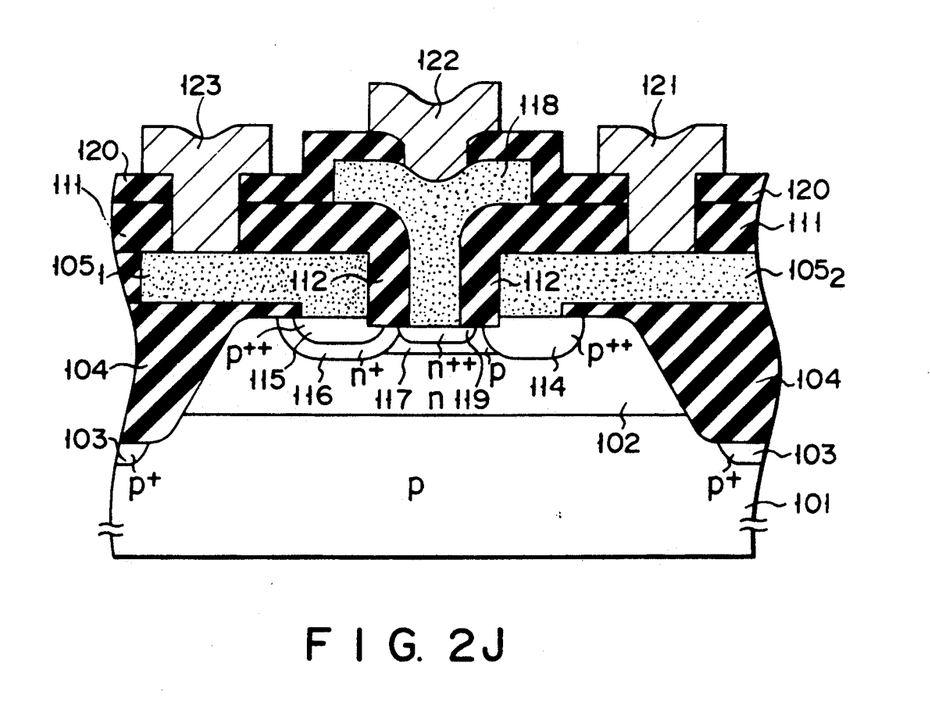

As is shown in FIG. 2J, the polysilicon layer 118 is patterned into a predetermined shape by photo etching, to thereby form a base electrode-leading layer 118. Thereafter, an oxide film 120 is formed on the semiconductor structure by a thermal oxidization process, for example. Then, three contact holes are formed in the oxide films 111 and 120 by photo etching for example, such that one of the contact holes is located at a predetermined position on the polysilicon layer 118 and the others are located at respective predetermined positions on the polysilicon layer 105. Subsequently, an aluminum layer is formed on the semiconductor structure by sputtering. This aluminum layer is patterned into a predetermined shape, to thereby form a collection electrode 121, a base electrode 122 and an emitter electrode 123. In this manner, the bipolar transistor according to one embodiment of the present invention is manufactured.

In the above-mentioned bipolar transistor and the manufacturing method, the base width is determined not by the image resolution limit of the lithography technique, as in the prior art, but by the impurity diffusion from the polysilicon layer 118. Therefore, the self-alignment type lateral-structure pnp bipolar transistor of the present invention and the manufacturing method thereof permit the base width to be as small as possible, resulting in improvement of frequency characteristics. In addition, they are suitable for obtaining a small-sized element.

A semiconductor device according to the present invention will be described, with reference to FIGS. 3 and 4.

Figure 3:
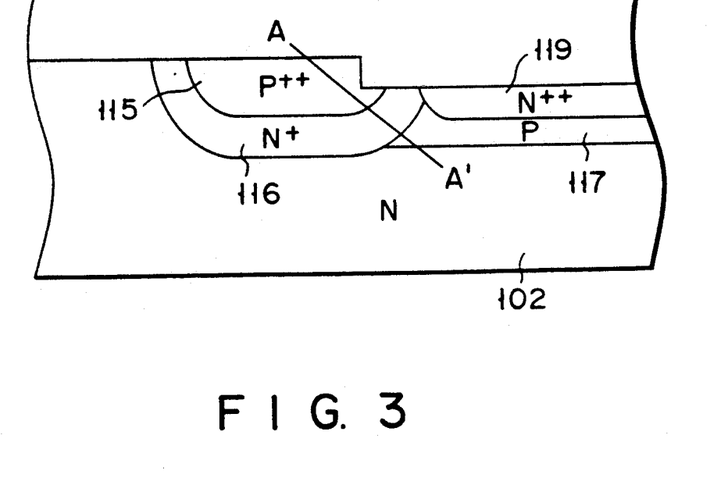
FIG. 3 is an enlarged view of the intrinsic transistor region of the transistor illustrated in FIG. 2J.

FIG. 3 is an enlarged view of the intrinsic transistor region of a self-alignment type lateral-structure pnp bipolar transistor obtained in accordance with the present invention. The reference numerals in FIG. 3 correspond to those used in FIG. 2J. FIG. 4 is a graph showing the impurity concentrations of the diffusion regions viewed in the plane taken along line A-A' in FIG. 3.

Referring first to FIG. 3, the intrinsic transistor region extends along the section taken on line A-A'. In other words, the intrinsic transistor region does not extend in the horizontal direction, but extends slantwise. Due to this construction, the emitter junction opposing the collection junction is large, in comparison with the case where the intrinsic transistor region extends in a completely horizontal direction. As a result, the current amplification factor can be satisfactory.

Figure 4:
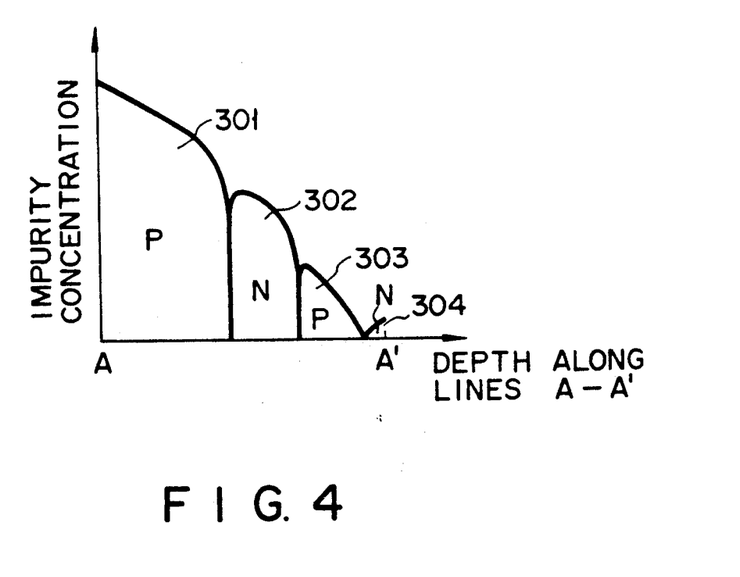
FIG. 4 is a graph showing how the impurity concentrations viewed in the plane taken along line A-A' in FIG. 3 are related with the depth.

Referring next to FIG. 4, reference numeral 301 denotes the relationships between the impurity concentration and depth of the emitter region 115, reference numeral 302 denotes the relationships between the impurity concentration and depth of the base region 116, reference numeral 303 denotes the relationships between the impurity concentration and depth of the collector region 117, and reference numeral 304 denotes the relationships between the impurity concentration and depth of the epitaxial layer 102. As can be understood from the impurity concentration profile shown in FIG. 4, the impurity concentration in the collector region 117 is low, as is indicated by 303, while that in the emitter region 11 is high, as is indicated by 301. Therefore, the impurity concentration profile is more like that of a vertical-structure type than that of a lateral-structure type. In light of this point as well, it can be understood that the current amplification factor is high and the dependency on the collector current is small.

As described above, the base width of a self-alignment type pnp bipolar transistor provided by the present invention is determined by impurity diffusion. Since, therefore, the base width can be determined without reference to the image resolution limit of the lithography technique, the bipolar transistor is suitable for the reduction of the size of an element. In addition, the transistor is improved in frequency characteristics. Moreover, since the impurity concentration profile of the transistor is more like that of a vertical-structure type than that of a lateral-structure type, the current amplification factor of the transistor is high. These advantages also apply to the method provided by the present invention.

What is claimed is:

1. A method for manufacturing a bipolar transistor, comprising the steps of:

forming a first insulation film on a semiconductor substrate;

exposing a predetermined surface portion of the semiconductor substrate by selectively removing the first insulation film;

forming a first polycrystalline semiconductor layer on the resultant semiconductor structure;

forming a first photoresist film having a predetermined pattern on the first polycrystalline semiconductor layer;

ion-implanting first impurities, which are of a first conductivity type, into the first polycrystalline semiconductor layer, using the first photoresist film as a mask;

removing the first photoresist film;

ion-implanting second impurities, which are of a second conductivity type and have a larger diffusion coefficient than that of the first impurities, into the first polycrystalline semiconductor layer through the entire surface thereof;

forming a second insulation film on the first polycrystalline semiconductor layer;

forming a second photoresist film having a predetermined pattern on the second insulation film;

forming an opening to expose a predetermined surface portion of the semiconductor substrate by selectively removing the second insulation film and the first polycrystalline semiconductor layer, using the second photoresist film as a mask, such that the first polycrystalline semiconductor layer is divided into: a second polycrystalline semiconductor layer containing both impurities of the first conductivity type and impurities of the second conductivity type; and a third polycrystalline semiconductor layer containing only impurities of the second conductivity type;

removing the second photoresist films;

forming a third insulation film on the resultant semiconductor structure;

exposing the predetermined surface portion of the semiconductor substrate once again, by selectively removing the third insulation film such that the third insulation film remains on side walls of the opening;

heat-treating the resultant semiconductor structure, so as both to form a fourth insulation film on the exposed surface portion of the semiconductor substrate and to activate the first and second impurities such that the semiconductor substrate contains: a first impurity-diffusion layer which is of the second conductivity type; a second impurity-diffusion layer which is of the first conductivity and is in contact with the first impurity-diffusion layer; and a third impurity-diffusion layer of the second conductivity;

ion-implanting third impurities of the first conductivity type into the fourth insulation film;

forming a fourth impurity-diffusion layer, which is of the first conductivity type and is in contact with both the second and third impurity-diffusion layers, by activating the third impurities implanted into the fourth insulation film;

exposing the predetermined surface portion of the semiconductor substrate once again, by removing the fourth insulation film;

forming a fourth polycrystalline semiconductor layer, which contains fourth impurities of the second conductivity, on the entire surface of the resultant semiconductor structure; and forming a fifth impurity-diffusion layer, which is of the first conductivity type, is located inside the fourth impurity-diffusion layer, and is contact with the second impurity-diffusion layer, by activating the fourth impurities to diffuse from the fourth polycrystalline semiconductor layer into the fourth impurity-diffusion layer.

* * * * *